United States Patent
Lee

(10) Patent No.: US 9,929,320 B2
(45) Date of Patent: Mar. 27, 2018

(54) WAVELENGTH CONVERSION FILM AND LIGHT EMITTING DEVICE PACKAGE INCLUDING THE SAME

(71) Applicant: SAMSUNG ELECTRONICS CO., LTD., Suwon-si (KR)

(72) Inventor: Joon Sub Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 14/971,551

(22) Filed: Dec. 16, 2015

(65) Prior Publication Data

US 2016/0181485 A1    Jun. 23, 2016

(30) Foreign Application Priority Data

Dec. 18, 2014 (KR) .................. 10-2014-0183491

(51) Int. Cl.
*H01L 33/50* (2010.01)
*H01L 33/60* (2010.01)
*H01L 33/48* (2010.01)

(52) U.S. Cl.
CPC .......... *H01L 33/505* (2013.01); *H01L 33/486* (2013.01); *H01L 33/507* (2013.01); *H01L 33/60* (2013.01); *H01L 2224/16245* (2013.01); *H01L 2933/0091* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,595,515 B2 * | 9/2009 | Thompson ............... C08J 3/243 257/103 |
| 7,696,525 B2 * | 4/2010 | Kim ...................... H01L 33/54 257/98 |

(Continued)

FOREIGN PATENT DOCUMENTS

| | | |
|---|---|---|
| JP | 2004-179644 A | 6/2004 |
| JP | 2005-268323 A | 9/2005 |

(Continued)

*Primary Examiner* — Lex Malsawma
(74) *Attorney, Agent, or Firm* — Sughrue Mion, PLLC

(57) ABSTRACT

A wavelength conversion film is provided and may include a first layer including a wavelength conversion material and an encapsulant encapsulating the wavelength conversion material, and a second layer attached to the first layer and having a refractive index less than a refractive index of the encapsulant and greater than a refractive index of air.

9 Claims, 12 Drawing Sheets

(56) References Cited

U.S. PATENT DOCUMENTS

| | | | |
|---|---|---|---|
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,956,375 B2* | 6/2011 | Li | H01L 33/54 257/434 |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,105,853 B2* | 1/2012 | Xu | H01L 33/54 438/27 |
| 8,129,711 B2 | 3/2012 | Kang et al. | |
| 8,134,292 B2 | 3/2012 | Yan | |
| 8,179,938 B2 | 5/2012 | Kim | |
| 8,263,987 B2 | 9/2012 | Choi et al. | |
| 8,324,646 B2 | 12/2012 | Lee et al. | |
| 8,324,649 B2* | 12/2012 | Lee | H01L 33/382 257/98 |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,530,920 B2* | 9/2013 | Tsai | H01L 25/0753 257/100 |
| 8,536,604 B2 | 9/2013 | Kwak et al. | |
| 8,735,931 B2 | 5/2014 | Han et al. | |
| 8,766,287 B2* | 7/2014 | Moon | H01L 33/382 257/88 |
| 8,766,295 B2 | 7/2014 | Kim | |
| 9,024,341 B2* | 5/2015 | Lee | H01L 33/54 257/84 |
| 2005/0040405 A1* | 2/2005 | Isokawa | H01L 33/54 257/79 |
| 2006/0054904 A1* | 3/2006 | Lin | H01L 25/0753 257/88 |
| 2006/0091788 A1* | 5/2006 | Yan | H01L 33/501 313/502 |
| 2007/0012940 A1* | 1/2007 | Suh | H01L 33/507 257/99 |
| 2007/0212802 A1* | 9/2007 | Lee | H01L 33/54 438/22 |
| 2008/0042546 A1 | 2/2008 | Huang et al. | |
| 2008/0142822 A1* | 6/2008 | Kim | H01L 33/54 257/98 |
| 2008/0224160 A1* | 9/2008 | Chang | H01L 33/58 257/98 |
| 2009/0008662 A1* | 1/2009 | Ashdown | H01L 25/0753 257/98 |
| 2009/0152582 A1* | 6/2009 | Chang | H01L 33/507 257/98 |
| 2010/0061106 A1* | 3/2010 | Shyu | G02B 3/08 362/311.02 |
| 2010/0230693 A1 | 9/2010 | Tran | |
| 2010/0308354 A1 | 12/2010 | David et al. | |
| 2011/0085352 A1 | 4/2011 | Ito et al. | |
| 2011/0114979 A1* | 5/2011 | Jang | H01L 33/486 257/98 |
| 2011/0193118 A1 | 8/2011 | Oshima et al. | |
| 2012/0018764 A1* | 1/2012 | Choi | H01L 33/20 257/99 |
| 2012/0104435 A1* | 5/2012 | Lee | H01L 33/54 257/98 |
| 2012/0119638 A1 | 5/2012 | Sato et al. | |
| 2012/0122255 A1 | 5/2012 | Shylo et al. | |
| 2012/0182714 A1 | 7/2012 | Kwon et al. | |
| 2012/0261690 A1* | 10/2012 | Lee | H01L 33/50 257/98 |
| 2012/0267661 A1* | 10/2012 | Kim | H01L 33/486 257/98 |
| 2013/0149508 A1 | 6/2013 | Kwak et al. | |
| 2013/0193837 A1* | 8/2013 | Ohno | B32B 15/00 313/498 |
| 2013/0299865 A1 | 11/2013 | Bechtel et al. | |
| 2015/0129833 A1* | 5/2015 | Yun | H01L 33/56 257/13 |

FOREIGN PATENT DOCUMENTS

| | | |
|---|---|---|
| JP | 2006-24615 A | 1/2006 |
| JP | 2007-227433 A | 9/2007 |
| JP | 2008-124168 A | 5/2008 |
| JP | 2010-16029 A | 1/2010 |
| JP | 2013-38353 A | 2/2013 |
| KR | 10-2006-0023431 A | 3/2006 |
| KR | 10-2006-0055934 A | 5/2006 |
| KR | 10-2011-0111121 A | 10/2011 |
| KR | 10-2012-0006731 A | 1/2012 |
| KR | 10-2012-0019385 A | 3/2012 |
| KR | 10-2012-0077612 A | 7/2012 |
| KR | 10-2013-0024511 A | 3/2013 |
| KR | 10-2013-0033740 A | 4/2013 |
| KR | 10-2013-0054635 A | 5/2013 |
| KR | 10-1300138 B1 | 8/2013 |
| KR | 10-2013-0114301 A | 10/2013 |

* cited by examiner

WAVELENGTH CONVERSION FILM AND LIGHT EMITTING DEVICE PACKAGE INCLUDING THE SAME

CROSS-REFERENCE TO RELATED APPLICATION

This application claims priority from Korean Patent Application No. 10-2014-0183491 filed on Dec. 18, 2014, with the Korean Intellectual Property Office, the disclosure of which is herein incorporated by reference.

BACKGROUND

1. Field

Apparatuses, devices, methods, and articles of manufacture consistent with the present disclosure relate to a wavelength conversion film and a light emitting device package including the same.

2. Description of Related Art

In general, light emitting device packages may be applied to various types of lighting devices, the backlights of display devices, automobile headlamps, and the like. Light emitting device packages may include a film to convert a wavelength of light emitted from a semiconductor light emitting device to produce an output light of a certain wavelength.

In the case of manufacturing a light emitting device package, a degradation in a degree of light uniformity due to a precipitation phenomenon or the like, may be prevented. However, as at least a portion of a surface of the film is directly exposed to air, a decrease in light extraction efficiency due to total reflection and internal reflection occurring at a boundary surface between the film and air may occur.

SUMMARY

It is an aspect to provide a wavelength conversion film having high light extraction efficiency by decreasing a quantity of light internally reflected from a boundary surface between the wavelength conversion film and air, and a light emitting device package including the same.

According to an aspect of an exemplary embodiment, a wavelength conversion film may include a first layer including a wavelength conversion material and an encapsulant encapsulating the wavelength conversion material; and a second layer attached to the first layer and having a refractive index less than a refractive index of the encapsulant and greater than a refractive index of air.

A thickness of the second layer may be less than a thickness of the first layer.

The second layer may have a first surface attached to the first layer and a second surface opposed to the first surface and having at least a portion thereof externally exposed.

The second layer may include an unevenness structure formed on at least a portion of the second surface.

A height of the unevenness structure may be less than a thickness of the second layer.

The refractive index of the second layer may be greater than about 1.0 and less than about 1.5.

According to an aspect of an exemplary embodiment, a light emitting device package may include a package body; a light emitting device coupled to at least a portion of the package body; and a wavelength conversion film disposed on the light emitting device so that light emitted by the light emitting device passes through the wavelength conversion film, wherein the wavelength conversion film comprises a wavelength conversion material that changes a wavelength of the light emitted by the light emitting device, and the wavelength conversion film includes a first layer disposed to be adjacent to the light emitting device and a second layer attached to the first layer and having a refractive index less than a refractive index of the first layer and greater than a refractive index of air.

A thickness of the second layer may be less than a thickness of the first layer.

The wavelength conversion film may include an unevenness structure formed on at least a portion of a surface of the second layer.

A height of the unevenness structure may be less than a thickness of the second layer.

The first layer may include the wavelength conversion material and an encapsulant encapsulating the wavelength conversion material, and the refractive index of the second layer may be less than a refractive index of the encapsulant.

The package body may include a reflective wall attached to a side surface of the light emitting device.

At least a portion of the first layer may be attached to an upper surface of the light emitting device and an upper surface of the reflective wall.

The upper surface of the light emitting device and the upper surface of the reflective wall may be coplanar.

The reflective wall may have substantially the same width in a height direction of the reflective wall.

The unevenness structure may comprise a plurality of unevenness structures that have at least one of a polypyramidal shape, a conical shape, and a hemispherical shape.

According to an aspect of an exemplary embodiment, there is provided a method of manufacturing a wavelength conversion film that includes a first layer including a wavelength conversion material and an encapsulant encapsulating the wavelength conversion material, and a second layer attached to the first layer, the method comprising disposing a mask on a film, the film having a refractive index value greater than a refractive index value of air; applying an encapsulant containing a wavelength conversion material to a space between portions of the mask, the encapsulant having a refractive index value greater than a refractive index value of the film; and removing the mask.

The encapsulant may be applied such that a thickness of the encapsulant is uniform and is substantially the same as a thickness of the mask.

The encapsulant may be applied such that a thickness of the encapsulant is greater than a thickness of the film.

BRIEF DESCRIPTION OF DRAWINGS

The above and other aspects will be more clearly understood from the following detailed description taken in conjunction with the accompanying drawings, in which.

DETAILED DESCRIPTION

Figure 1A:
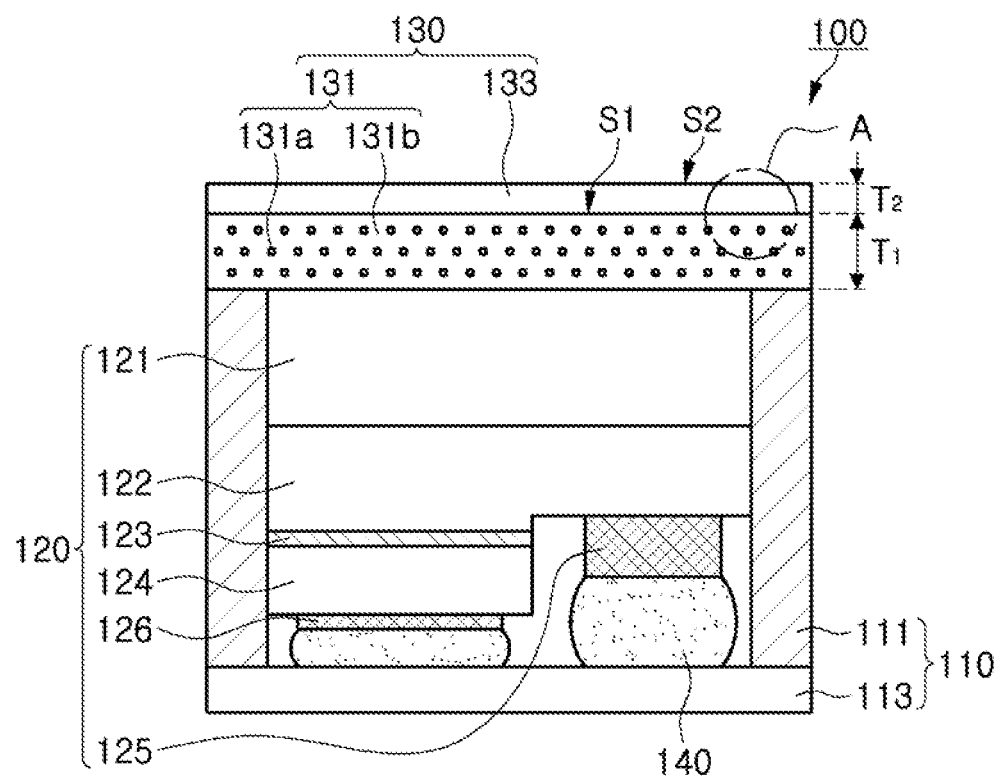
FIGS. 1A through 3 are views respectively illustrating light emitting device packages according to exemplary embodiments.

Various exemplary embodiments will now be described more fully with reference to the accompanying drawings in which some exemplary embodiments are shown. The present inventive concept may, however, be embodied in different forms and should not be construed as limited to the exemplary embodiments set forth herein. Rather, these exemplary embodiments are provided so that this disclosure is thorough and complete and fully conveys the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms "first", "second", "third", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could be termed a "second" element, component, region, layer or section without departing from the teachings of the present disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an exemplary embodiment can be implemented differently, functions or operations described in a particular block may occur in a different way from a flow described in the flowchart. For example, two consecutive blocks may be performed simultaneously, or the blocks may be performed in reverse according to related functions or operations.

Exemplary embodiments of the present inventive concept will now be described in detail with reference to the accompanying drawings.

The inventive concept may, however, be embodied in many different forms and should not be construed as being limited to the specific exemplary embodiments set forth herein. Rather, these exemplary embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIGS. 1A through 3 are views respectively illustrating light emitting device packages according to exemplary embodiments.

Referring to FIG. 1A, a light emitting device package 100 according to an exemplary embodiment may include a package body 110, a light emitting device 120, and a wavelength conversion film 130. The package body 110 may include a reflective wall 111 and a package substrate 113 transferring an electrical signal to the light emitting device 120.

The light emitting device 120 may include a support substrate 121, a first conductivity-type semiconductor layer 122, an active layer 123, a second conductivity-type semiconductor layer 124 and the like, sequentially stacked from the support substrate 121. The first conductivity-type semiconductor layer 122 and the second conductivity-type semiconductor layer 124 may be electrically connected to a first electrode 125 and a second electrode 126, respectively, and the light emitting device 120 may be mounted on the package substrate 113 through solder bumps 140. That is, in the exemplary embodiment of FIG. 1A, the light emitting device 120 may be flip-chip bonded to the package substrate 113, and light generated from the light emitting device 120 may be externally emitted through the support substrate 121 and the wavelength conversion film 130.

When an electrical signal is applied to the light emitting device 120 through the package substrate 113, light may be generated due to the recombination of electrons and holes supplied from the first conductivity-type semiconductor layer 122 and the second conductivity-type semiconductor layer 124. Light generated due to the recombination of electrons and holes may be directly emitted upwardly through the support substrate 121 having light-transmissive properties and the wavelength conversion film 130, or may be reflected by the reflective wall 111 or the first and second electrodes 125 and 126 and the like and then be upwardly emitted through the support substrate 121 and the wavelength conversion film 130.

In some exemplary embodiments, the first conductivity-type semiconductor layer 122 may be an n-type nitride semiconductor layer and the second conductivity-type semiconductor layer 124 may be a p-type nitride semiconductor layer. Due to characteristics of the p-type nitride semiconductor layer in which a resistance level thereof is higher than that of the n-type nitride semiconductor layer, ohmic contact between the second conductivity-type semiconductor layer 124 and the second electrode 126 may be difficult. Thus, in order to secure the ohmic contact between the second conductivity-type semiconductor layer 124 and the second electrode 126, a contact area between the second conductivity-type semiconductor layer 124 and the second electrode 126 may be relatively large. That is, the second electrode 126 may have a surface area relatively larger than that of the first electrode 125.

In addition, in terms of characteristics of the light emitting device 120 from which light is mainly extracted in a direction toward an upper portion of the light emitting device 120 to which the support substrate 121 is attached, the second electrode 126 may be formed of a material having a high degree of reflectance, whereby light extraction efficiency of the light emitting device package may be improved. In order that light generated in the active layer 123 due to the recombination of electrons and holes is reflected to be emitted outwardly through the support substrate 121, the second electrode 126 may contain a material having excellent reflectance such as Ag, Ni, Al, Rh, Pd, Jr, Ru, Mg, Zn, Pt, Au or the like.

The reflective wall 111 may be disposed on a side surface of the light emitting device 120. The reflective wall 111 may contain a metallic oxide having excellent reflectance such as $TiO_2$. An interior surface of the reflective wall 111 may be directly attached to the side surface of the light emitting device 120 as illustrated in FIG. 1A, but is not limited to having such a form. For example, although the reflective wall 111 is shown in FIG. 1A to be substantially parallel to the side of the device package 100, this is only an example and, in some exemplary embodiments, the reflective wall 111 may be sloped or slanted such that the width in the height direction is not constant. An upper surface of the reflective wall 111 may form a coplanar surface with an upper surface of the support substrate 121 included in the light emitting device 120, and the wavelength conversion film 130 may be attached to the coplanar surface formed by the upper surfaces of the reflective wall 111 and the support substrate 121.

The wavelength conversion film 130 may include a first layer 131 and a second layer 133 sequentially stacked on the light emitting device 120. The first layer 131 may include a wavelength conversion material 131a receiving at least a portion of light emitted from the light emitting device 120 and converting a wavelength thereof and an encapsulant 131b containing the wavelength conversion material 131a. By way of example, when the light emitting device 120 emits blue light, the wavelength conversion film 130 that has the wavelength conversion material 131a excited by blue light and generating yellow light may be included in the light emitting device package 100, whereby the light emitting device package 100 emitting white light may be manufactured.

The second layer 133, a layer provided to increase light extraction efficiency of the light emitting device package 100, may contain a material having a refractive index lower than that of the encapsulant 131b included in the first layer 131 and higher than that of air. For example, in the case that the encapsulant 131b contains a resin, since a refractive index of the encapsulant 131b is approximately 1.5 and a refractive index of air is 1.0, the second layer 133 may be formed of a material having a refractive index higher than 1.0 and lower than 1.5, for example, magnesium fluoride ($MgF_2$), epoxy resin or the like. The limit of numerical values as described above may be modified according to various exemplary embodiments. In another example, the encapsulant 131b is formed of a material having a refractive index higher than 1.5, the second layer 133 may be formed of a silicon nitride ($SiN_x$), a silicon oxide ($SiO_x$) or the like, in addition to magnesium fluoride ($MgF_2$) and epoxy resin.

Transmittance and reflectance values of light passing through mediums having different refractive indices may be calculated by the Fresnel equation. When a light passes through a first medium having a high refractive index n1 and a second medium having a low refractive index n2, sequentially, transmittance T of the light in a boundary surface between the first medium and the second medium may be calculated according to the following Mathematical Equation 1.

$$T = \frac{4 \times n1 \times n2}{(n1 + n2)^2} \quad \text{[Mathematical Equation 1]}$$

Hereinafter, with reference to FIG. 1B and Mathematical Equation 1, effects of improving light extraction efficiency of light generated from the wavelength conversion film 130 including the second layer 133 will be described.

Figure 1B:
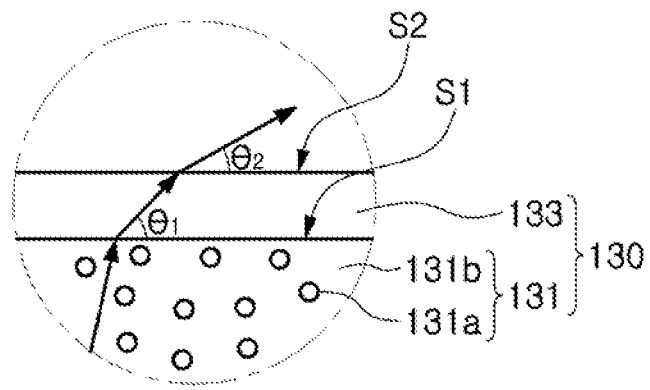

FIG. 1B is an enlarged view of region A of the light emitting device package 100 illustrated in FIG. 1A. Referring to FIG. 1B, internal reflection may be formed on each of a boundary surface S1 between the first layer 131 and the second layer 133 of the wavelength conversion film 130 and a boundary surface S2 between the second layer 133 and air. In the case that a refractive index of the encapsulant 131b included in the first layer 131 is 1.5 and a refractive index of the second layer 133 is 1.3, a value lower than that of the encapsulant 131b and higher than that of air, transmittance values in the boundary surfaces S1 and S2 may be calculated as 0.995 and 0.983, respectively. Thus, light transmittance of the overall wavelength conversion film 130 may be approximately 0.978.

On the other hand, in the case of a wavelength conversion film having a single layer and manufactured by containing a wavelength conversion material in an encapsulant having a refractive index of approximately 1.5, light transmittance in a boundary surface between an upper surface of the wavelength conversion film and air may be approximately 0.960. That is, the light emitting device package 100 including the wavelength conversion film 130 including the second layer 133 may have a higher degree of light transmittance as compared to the case of a light emitting device package 100 including the wavelength conversion film 130 in which the second layer 133 is not included.

As illustrated in FIG. 1B, since the refractive index of the second layer 133 is lower than that of the first layer 131 and higher than that of air, light emitted from the light emitting device 120 may be refracted in a boundary surface between the first and second layers 131 and 133 and a boundary surface between the second layer 133 and air. In the case that an angle between the boundary surface between the first and second layers 131 and 133 and a path of light is defined as $\theta_1$ and an angle between the boundary surface between the second layer 133 and air and the path of light is defined as $\theta_2$, the relationship of $\theta_1 > \theta_2$ due to refractive indices of the first and second layers 131 and 133 and air may be established. The internal reflection generated within the wavelength conversion film 130 may be reduced, whereby light extraction efficiency may be increased and luminance may be improved.

Meanwhile, a thickness $T_1$ of the first layer 131 included in the wavelength conversion film 130 may be greater than a thickness $T_2$ of the second layer 133. The thickness $T_2$ of the second layer 133 may be several to several tens of micrometers thick, and in consideration of skin depth, may be greater than a wavelength of light emitted from the light emitting device 120. However, thicknesses of the first and second layers 131 and 133 are not limited to having the degrees of thickness as described above, and in some exemplary embodiments, the thickness $T_2$ of the second layer 133 may be greater than the thickness $T_1$ of the first layer 131.

Meanwhile, the wavelength conversion material 131a may be a material capable of being excited by light emitted from the light emitting device 120 and converting at least a portion of the light into light having a different wavelength. The wavelength conversion material 131a may contain, for example, phosphors or quantum dots. As the wavelength conversion material 131a, two or more types of material providing light having different wavelengths may be used. Light having been converted or light not having been converted by the wavelength conversion material 131a may be mixed with each other to thereby generate white light. In an example, light generated in the light emitting device 120 may be blue light and the wavelength conversion material 131a may contain at least one of a green phosphor, a yellow phosphor, an orange phosphor and a red phosphor.

The first conductivity-type semiconductor layer 122 and the second conductivity-type semiconductor layer 124 included in the light emitting device 120 may be an n-type semiconductor layer and a p-type semiconductor layer, respectively, as described above. By way of example, the first conductivity-type semiconductor layer 122 and the second conductivity-type semiconductor layer 124 may be formed of a group III nitride semiconductor, for example, a material having a composition of $Al_xIn_yGa_{1-x-y}N$ ($0 \leq x \leq 1$, $0 \leq y \leq 1$, $0 \leq x+y \leq 1$). The materials of the first conductivity-type semiconductor layer 122 and the second conductivity-type semiconductor layer 124 are not limited thereto, and may be an AlGaInP based semiconductor or an AlGaAs based semiconductor.

Meanwhile, in some exemplary embodiments, the first and second conductivity-type semiconductor layers 122 and 124 may have a single layer structure, and in other exemplary embodiments, the first and second conductivity-type semiconductor layers 122 and 124 may have a multilayer structure in which respective layers have different compositions, thicknesses or the like. For example, each of the first and second conductivity-type semiconductor layers 122 and 124 may include a carrier injection layer capable of improving injection efficiency of electrons and holes, and further, may have a superlattice structure formed in various manners.

The first conductivity-type semiconductor layer 122 may further include a current spreading layer in a portion thereof adjacent to the active layer 123. The current spreading layer may have a structure in which a plurality of $Al_xIn_yGa_{1-x-y}N$ ($0 \leq x \leq 1$, $0 \leq y \leq 1$, $0 \leq x+y \leq 1$) layers having different compositions or different impurity contents are repeatedly stacked or may be partially formed of an insulating material layer.

The second conductivity-type semiconductor layer 124 may further include an electron blocking layer in a portion thereof adjacent to the active layer 123. The electron blocking layer may have a structure in which a plurality of $Al_xIn_yGa_{1-x-y}N$ layers having different compositions are stacked or may have at least one layer configured of $Al_yGa_{(1-y)}N$. The second conductivity-type semiconductor layer 124 may have a band gap greater than that of the active layer 123 to prevent electrons from passing over the second conductivity-type semiconductor layer 124.

The light emitting device 120 may be formed using an MOCVD device. In order to manufacture the light emitting device 120, an organic metal compound gas (for example, trimethylgallium (TMG), trimethyl aluminum (TMA) or the like) and a nitrogen-containing gas (for example, ammonia ($NH_3$) or the like) may be supplied as a reaction gas, to a reaction container in which a growth substrate is disposed, and a temperature of the substrate may be maintained at a high temperature of approximately 900° C. to approximately 1100° C., such that gallium nitride compound semiconductors may be grown on the substrate while supplying an impurity gas thereto in some exemplary embodiments, to thereby allow the gallium nitride compound semiconductors to be stacked as an undoped layer, an n-type layer, and a p-type layer, on the substrate. An n-type impurity may be Si, widely known in the art and a p-type impurity may be Zn, Cd, Be, Mg, Ca, Ba or the like. As the p-type impurity, Mg and Zn may mainly be used.

In addition, the active layer 123 interposed between the first and second conductivity-type semiconductor layers 122 and 124 may have a multiple quantum well (MQW) structure in which quantum well layers and quantum barrier layers are alternately stacked. For example, in the case that the active layer 123 includes a nitride semiconductor, the active layer 123 may have a multiple quantum well (MQW) structure in which GaN and InGaN are alternately stacked. In some exemplary embodiments, the active layer 123 may have a single quantum well (SQW) structure.

Figure 2A:
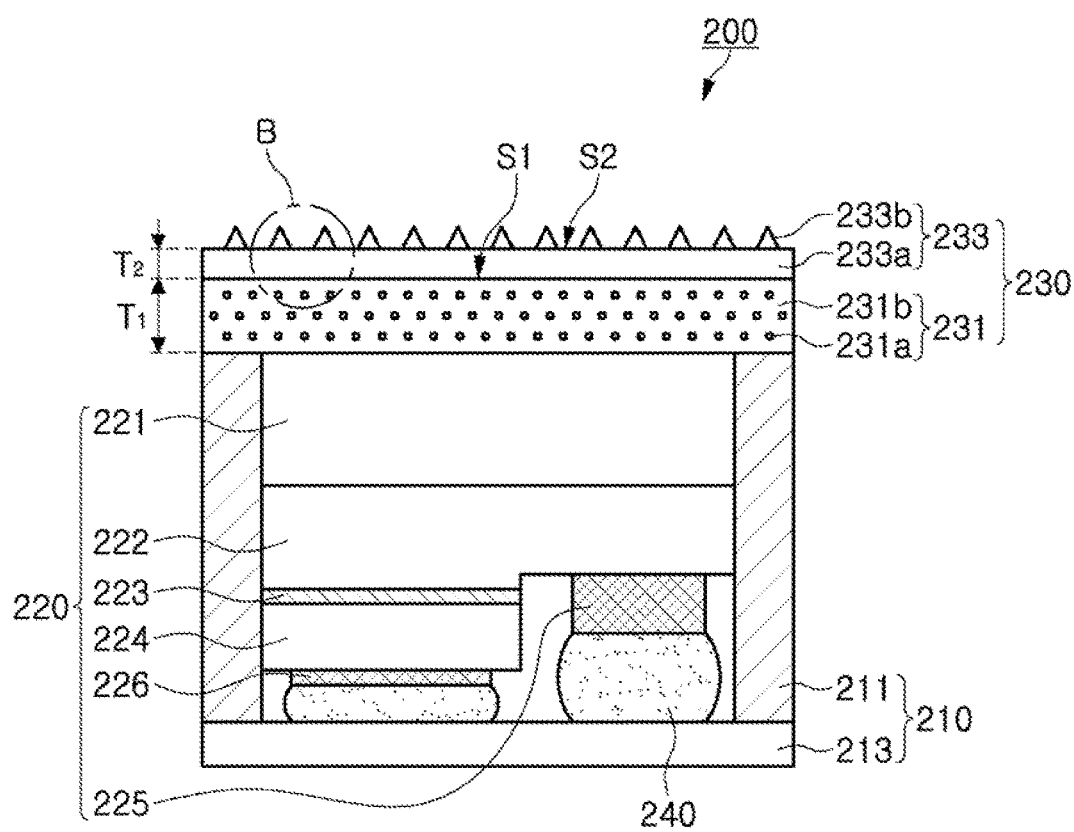

FIG. 2A is a view illustrating a light emitting device package 200 according to another exemplary embodiment. Referring to FIG. 2A, the light emitting device package 200 may include a package body 210 including a reflective wall 211, a circuit board 213 and the like, a light emitting device 220, a wavelength conversion film 230 and so on. The light emitting device 220 may include a support substrate 221 having light-transmissive properties, first and second conductivity-type semiconductor layers 222 and 224, an active layer 223, first and second electrodes 225 and 226, and the like. The first and second electrodes 225 and 226 may be electrically connected to circuit patterns of the circuit board 213 through solder bumps 240 or the like.

The reflective wall 211 may contain a material having excellent reflectance such as $TiO_2$. Although FIG. 2A illustrates a case in which an interior surface of the reflective wall 211 is attached to the side surface of the light emitting device 220, the reflective wall 211 is not limited to having such a form. The reflective wall 211 may be disposed to be spaced apart from the light emitting device 220 by a distance. The distance may be predetermined. In this case, the interior surface of the reflective wall 211 may be substantially parallel to the side surface of the light emitting device 220. Meanwhile, the reflective wall 211 may have a substantially constant width in a height direction thereof. However, this is only an example and, in some exemplary embodiments, the reflective wall 211 may be sloped or slanted such that the width in the height direction is not constant.

Referring to FIG. 2A, the wavelength conversion film 230 may include a first layer 231 and a second layer 233. At least a portion of the first layer 231 may be attached to the light emitting device 220, and the first layer 231 may include a wavelength conversion material 231a and an encapsulant 231b. The wavelength conversion material 231a may be excited by light emitted by the light emitting device 220 and may generate light having a wavelength different from that of light emitted by the light emitting device 220.

The second layer 233 may include a low-refractive index film 233a and unevenness structures 233b provided on a second surface S2 of the low-refractive index film 233a. The low-reflective index film 233a may be disposed such that a first surface S1 there of faces the first layer 231. The low-refractive index film 233a may contain a material having a refractive index lower than that of the encapsulant 231b of the first layer 231. For example, in the case that a refractive index of the encapsulant 231b is approximately 1.5, the low-refractive index film 233a may be formed of a material having a refractive index lower than 1.5, for example, magnesium fluoride ($MgF_2$), epoxy resin or the like. The unevenness structures 233b may have conical shapes, polypyramidal shapes, hemispherical shapes or the like. The unevenness structures 233b may be formed on at least a portion of the second surface S2 of the low-refractive index film 233a. Since the unevenness structures 233b are formed on a boundary surface between the low-refractive index film 233a and air, light extraction efficiency may be further increased.

Figure 2B:
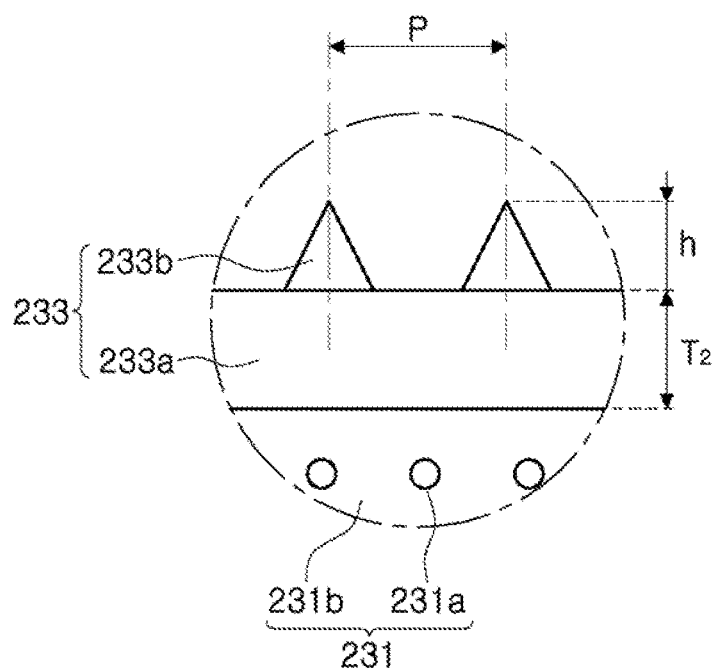

A size and a shape of each of the unevenness structures 233b may be variously determined. Referring to FIG. 2B which shows an enlarged view of region B of the light emitting device package 200 illustrated in FIG. 2A, a height h of the unevenness structures 233b may be less than a distance P between the unevenness structures 233b. That is, h<P. In some exemplary embodiments, the unevenness structures 233b may be provided at an interval indicated by distance P, such that the unevenness structures 233b are spaced evenly apart from each other. However, in other exemplary embodiments, the unevenness structures 233b may be positioned at varying distances with a minimum distance being the distance P. By way of example, in the case that a thickness $T_2$ of the low-refractive index film 233a included in the second layer 233 is 30 μm, the unevenness structures 233b respectively having a height of 20 μm and a conical shape may be formed at intervals of 30 μm, whereby light extraction efficiency may be improved by approximately 3%.

Figure 3:
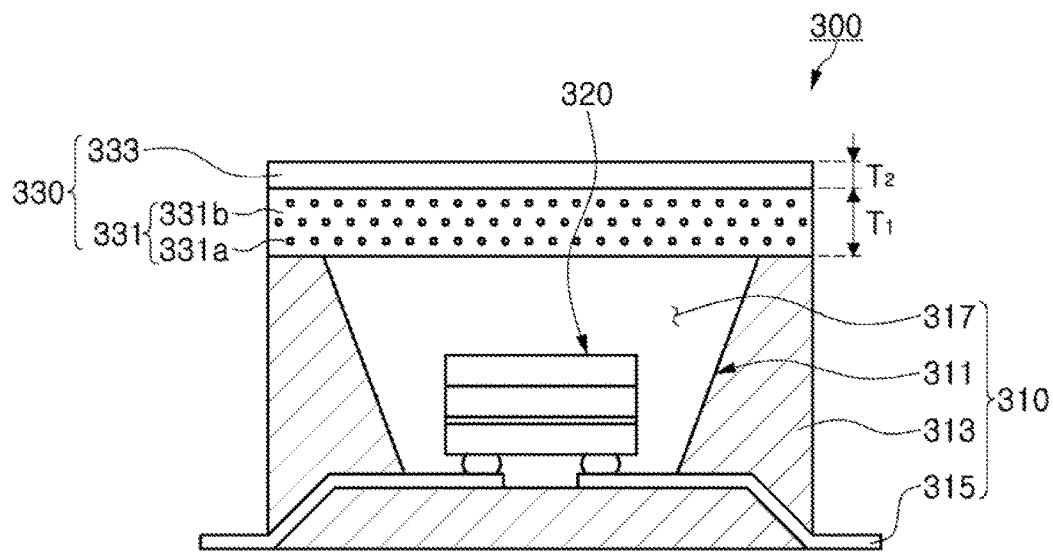

FIG. 3 is a view illustrating a light emitting device package 300 according to another exemplary embodiment.

Referring to FIG. 3, a package body 310 may include a reflective wall 311, a body portion 313, lead frames 315 and the like. The body portion 313 may include a mounting space 317 provided by removing at least a partial region thereof. At least portions of the lead frames 315 may be exposed in the mounting space 317 and in the mounting space 317, a light emitting device 320 may be mounted on the lead frames 315. Although FIG. 3 illustrates a case in which the light emitting device 320 is flip-chip bonded to the lead frames 315, the light emitting device 320 may also be electrically connected to the lead frames 315 through a wire or the like, unlike the case of FIG. 3.

The reflective wall 311 may be a wall adjacent to the light emitting device 320 in the mounting space 317 and may be formed by coating a partial surface of the body portion 313 with a material having a high degree of reflectance. The mounting space 317 may be filled with air without a separate process or may be filled with a separate encapsulant. In another example, the mounting space 317 may be provided in a vacuum state.

A wavelength conversion film 330 may be attached to an upper portion of the package body 310. The wavelength conversion film 330 may include a first layer 331 and a second layer 333 sequentially stacked from the light emitting device 320, and the first layer 331 may include a wavelength conversion material 331a and an encapsulant 331b. A thickness $T_1$ of the first layer 331 may be greater than a thickness $T_2$ of the second layer 333, but is not limited thereto.

The second layer 333 may have a refractive index lower than that of the encapsulant 331b included in the first layer 331. In the case that the encapsulant 331b is formed of a silicon resin such as $SiO_2$, the refractive index of the encapsulant 331b may be approximately 1.5 and, in this case, the second layer 333 may be formed of epoxy resin or the like, having a refractive index lower than 1.5. As described above, since the second layer 333 having a refractive index relatively lower than that of the first layer may be formed on the first layer 331, a light extraction efficiency of light emitted from the light emitting device 320 may be improved. Meanwhile, the refractive index of the second layer 333 may be higher than a refractive index of air (i.e., 1.0) to which an upper surface of the second layer 333 is exposed.

FIGS. 4 through 7 are views illustrating a method of manufacturing a wavelength conversion film for a light emitting device package according to an exemplary embodiment.

Figure 4:
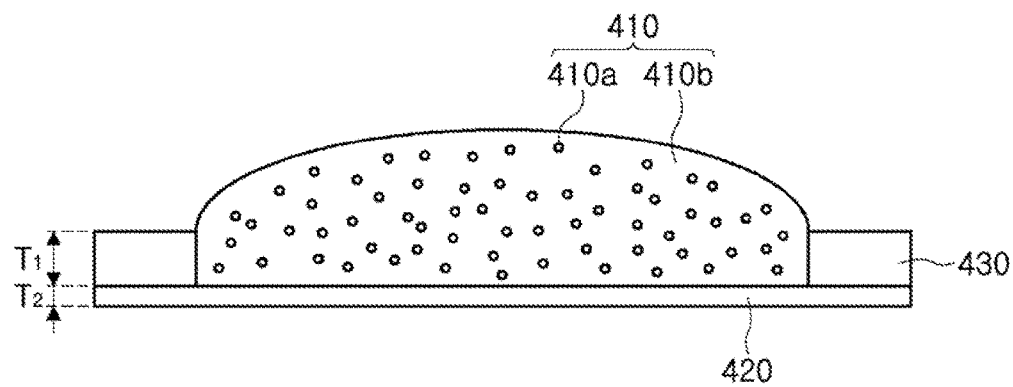
FIGS. 4 through 7 are views illustrating a method of manufacturing a wavelength conversion film for the light emitting device package according to an exemplary embodiment.

Referring to FIG. 4 first, the method of manufacturing a wavelength conversion film according to an exemplary embodiment may start with applying an encapsulant 410b containing a wavelength conversion material 410a to a space between portions of a mask 430 after preparing the mask 430 on a low-refractive index film 420. The encapsulant 410b containing the wavelength conversion material 410a may have a refractive index relatively larger than that of the low-refractive index film 420. In some exemplary embodiments, the low-refractive index film 420 may contain epoxy resin and have a refractive index of approximately 1.4 and the encapsulant 410b may contain a silicon oxide and have a refractive index of approximately 1.5. Materials contained in the low-refractive index film 420 and the encapsulant 410b may be variously modified in addition to the materials.

Figure 5:
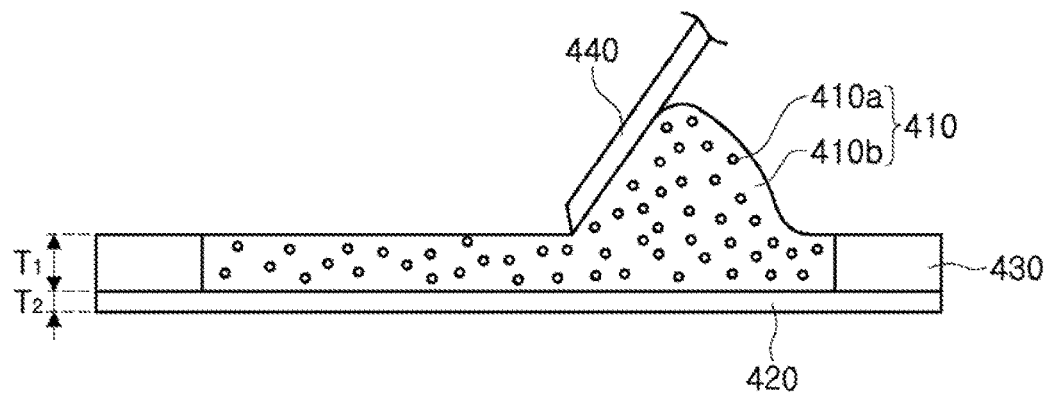

The mask 430 may be disposed to be adjacent to an edge of the low-refractive index film 420 and may partially expose a surface of the low-refractive index film 420. The encapsulant 410b may be applied to the space between portions of the mask 430 through a method such as a dispensing method or the like. When the encapsulant 410b is applied, the encapsulant 410b applied between portions of the mask 430 may be spread using a blade 440 or the like as illustrated in FIG. 5, whereby a thickness of the encapsulant 410b may be made uniform. In this case, a thickness to which the encapsulant 410b is applied may be substantially identical to a thickness of the mask 430. Thus, the thickness of the encapsulant 410b may be controlled by adjusting the thickness of the mask 430. In an exemplary embodiment, a thickness $T_1$ of the encapsulant 410b may be greater than a thickness $T_2$ of the low-refractive index film 420.

Figure 6:
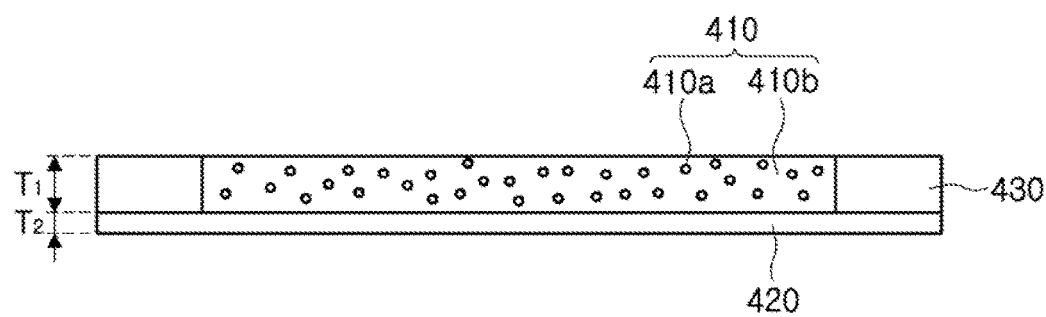
Figure 7:
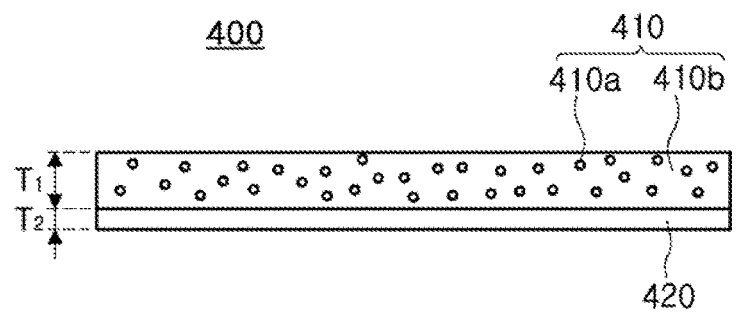

Referring to FIGS. 6 and 7, after curing the encapsulant 410b applied to have a uniform thickness in FIG. 6, the mask 430 may be removed to thereby manufacture a wavelength conversion film 400 as shown in FIG. 7. The wavelength conversion film 400 may have a structure in which a plurality of layers are stacked. That is, the wavelength conversion film 400 may include a first layer 410 having the wavelength conversion material 410a and the encapsulant 410b, and a second layer 420 provided as a low-refractive index film.

The wavelength conversion film 400 may be included within the light emitting device package so that it may be positioned in a path of light along which light emitted from the light emitting device moves, and in this case, the wavelength conversion film 400 may be included within the light emitting device package in such a matter than the first layer 410 may be disposed to be closer to the light emitting device than the second layer 420. Thus, light emitted from the light emitting device may sequentially pass through the first layer 410 and the second layer 420 and may be emitted externally, and a degradation in a light extraction efficiency due to an internal reflection of the wavelength conversion film 400 may be prevented.

Meanwhile, the manufacturing process illustrated in FIGS. 4 through 7 is merely provided as an example for manufacturing the wavelength conversion film 400, and the wavelength conversion film 400 may also be manufactured through a process different from that illustrated in FIGS. 4 through 7. By way of example, the wavelength conversion film 400 may also be manufactured by attaching the second layer 420 to the first layer 410 containing the wavelength conversion material 410a and previously fabricated in a film shape.

Figure 8:
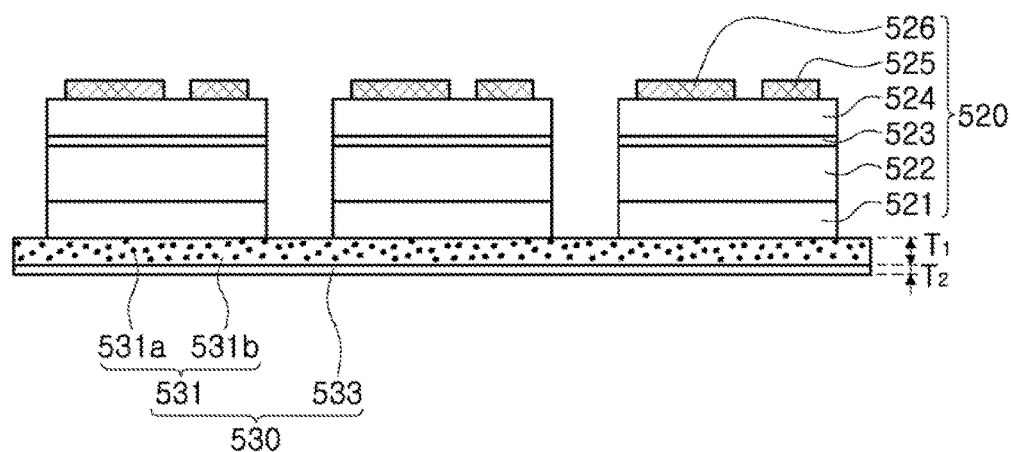
FIGS. 8 through 10 are views illustrating a method of manufacturing a light emitting device package according to an exemplary embodiment.
Figure 9:
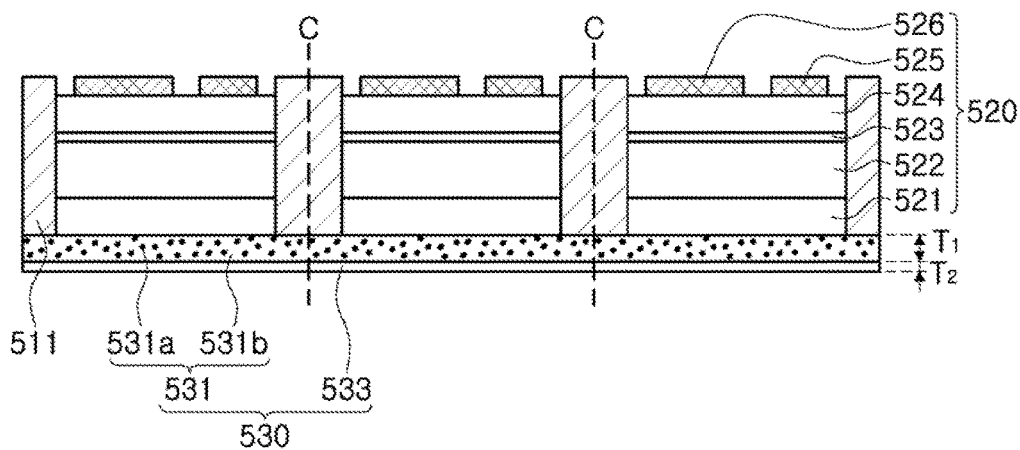
Figure 10:
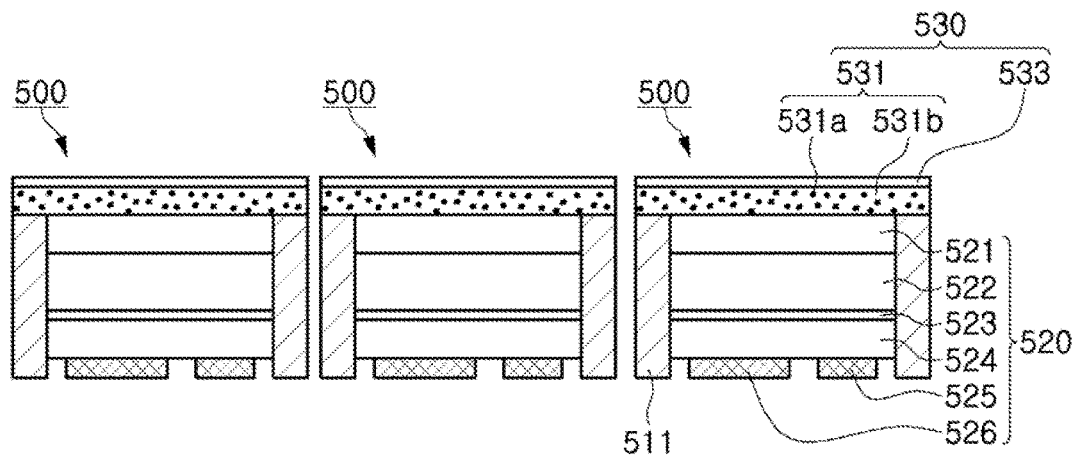

FIGS. 8 through 10 are views illustrating a method of manufacturing a light emitting device package according to an exemplary embodiment.

Referring to FIG. 8, the method of manufacturing a light emitting device package may start with disposing at least one or more light emitting devices 520 on a wavelength conversion film 530. The wavelength conversion film 530 may include a first layer 531 including a wavelength conversion material 531a and an encapsulant 531b, and a second layer 533 attached to the first layer 531, and a manufacturing process of the wavelength conversion film 530 may be conducted according to the exemplary embodiment illustrated in FIGS. 4 through 7.

Each of the light emitting devices 520 may include a support substrate 521 having light-transmissive properties, a first conductivity-type semiconductor layer 522, an active layer 523, a second conductivity-type semiconductor layer 524, and first and second electrodes 525 and 526. In some exemplary embodiments, the second electrode 526 may be directly disposed on the second conductivity-type semiconductor layer 524 in order to come into ohmic-contact therewith. The first electrode 525 may be electrically connected to the first conductivity-type semiconductor layer 522 through a conductive via or the like provided in the light emitting device 520.

The light emitting device 520 may be disposed on one surface of the first layer 531 containing the wavelength conversion material 531a. That is, at least a portion of the first layer 531 may be attached to the light emitting device 520. The first layer 531 and the second layer 533 may be sequentially stacked from the light emitting device 520. As described above, a thickness $T_1$ of the first layer 531 may be greater than a thickness $T_2$ of the second layer 533, and the second layer 533 may have a refractive index lower than that of the first layer 531.

Referring to FIG. 9, a reflective wall 511 may be formed in a space between the one or more light emitting devices 520. In order to form the reflective wall 511, a white molding composite material containing a filler may be injected into a space between the light emitting devices 520 disposed on the wavelength conversion film 530, using a dispenser and the like and then, curing the material. The filler may contain one or more of $SiO_2$, $TiO_2$, $Al_2O_3$ and the like, and may have nano-sized particles contained in the white molding composite material. The white molding composite material may contain a thermosetting resin or silicon resin having high heat resistance properties, or may contain a thermoplastic resin to which a white pigment and a filler, a curing agent, a releasing agent, an antioxidant agent, an adhesion improver or the like may be added.

When the reflective wall 511 is formed, the reflective wall 511 is cut along a cutting line C between the light emitting devices 520 to thereby form light emitting device packages 500. Referring to FIG. 10, each of the light emitting device packages 500 may include the wavelength conversion film 530, the reflective wall 511, and the light emitting device 520. Unlike the exemplary embodiment of FIGS. 9 and 10, after forming the reflective wall 511, a circuit board may be attached to the first and second electrodes 525 and 526 of the light emitting device 520 and may be cut off together with the reflective wall 511, such that the light emitting device packages 500 may be formed.

Referring to FIG. 10, light generated in the active layer 523 of the light emitting device 520 may be emitted directly through the support substrate 521 or may be reflected by the reflective wall 511 and the first and second electrodes 525 and 526 and then be emitted through the support substrate 521. Thus, the wavelength conversion film 530 may be positioned in a path of light along which light emitted from the light emitting device 520 moves. At least a portion of the wavelength conversion material 531 included in the first layer 531 of the wavelength conversion film 530 may be excited by light emitted from the light emitting device 520 and may convert at least a portion of the light emitted from the light emitting device 520 into light having a different wavelength. Since the second layer 533 disposed on the first layer 531 may have a refractive index lower than that of the first layer 531, a quantity of light not emitted externally due to internal reflection within the wavelength conversion film 530 may be decreased and consequently, a light extraction efficiency may be improved.

FIGS. 11 through 16 are views illustrating light emitting devices applicable to the light emitting device package according to various exemplary embodiments.

Figure 11:
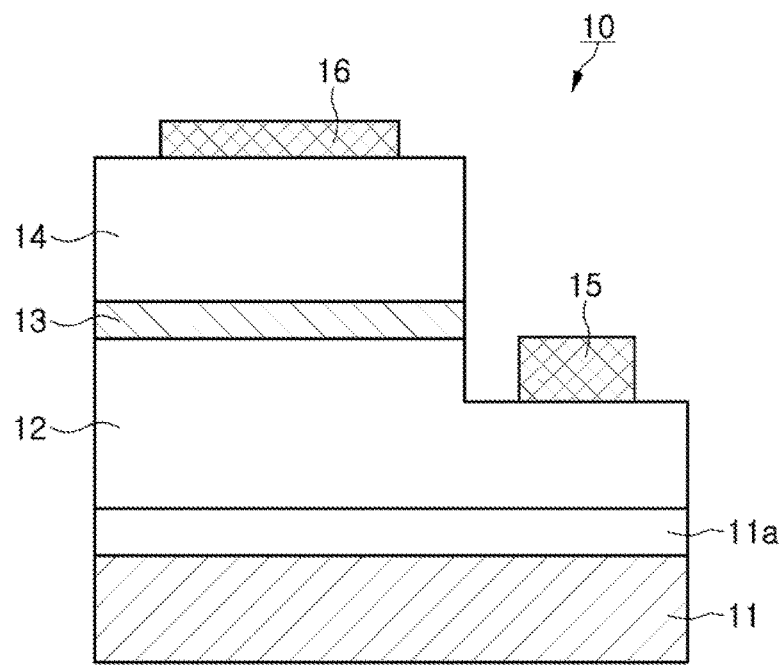
FIGS. 11 through 16 are views illustrating semiconductor light emitting devices applicable to the light emitting device package according to an exemplary embodiment.

Referring to FIG. 11, a light emitting device 10 according to an exemplary embodiment may include a substrate 11, a first conductivity-type semiconductor layer 12, an active layer 13, and a second conductivity-type semiconductor layer 14. In addition, a first electrode 15 may be formed on the first conductivity-type semiconductor layer 12 and a second electrode 16 may be formed on the second conductivity-type semiconductor layer 14. An ohmic-contact layer may be further selectively provided between the second electrode 16 and the second conductivity-type semiconductor layer 14.

According to various exemplary embodiments, the substrate 11 may be at least one of an insulating substrate, a conductive substrate and a semiconductor substrate. The substrate 11 may be, for example, sapphire, SiC, Si, $MgAl_2O_4$, MgO, $LiAlO_2$, $LiGaO_2$, or GaN. A homogeneous substrate, a GaN substrate may be selected as the substrate 11 for epitaxial growth of a GaN material, and a heterogeneous substrate may be mainly, sapphire, silicon carbide (SiC) or the like. In the case of using the heterogeneous substrate, defects such as dislocations and the like may be caused due to a difference in lattice constants between a substrate material and a film material. In addition, warpage may occur at the time of a temperature variation due to a difference in coefficients of thermal expansion between the substrate material and the film material, and such a warpage phenomenon may cause cracks in the film. In order to address such defects, a buffer layer 11a may be disposed between the substrate 11 and the first conductivity-type semiconductor layer 12 provided as a GaN based layer.

In the case of growing the first conductivity-type semiconductor layer 12 containing GaN on the heterogeneous substrate, a dislocation density may be increased due to a mismatch in lattice constants between the substrate material and the film material, and cracks and warpage may occur due to the difference in coefficients of thermal expansion. In order to prevent the dislocation and cracks as described above, the buffer layer 11a may be disposed between the substrate 11 and the first conductivity-type semiconductor layer 12. The buffer layer 11a may adjust a degree of warpage of the substrate when an active layer is grown, to reduce a wavelength dispersion of a wafer.

The buffer layer 11a may be made of $Al_xIn_yGa_{1-x-y}N$ ($0 \leq x \leq 1$, $0 \leq y \leq 1$), in particular, GaN, AlN, AlGaN, InGaN, or InGaN/AlN, and a material such as $ZrB_2$, $HfB_2$, ZrN, HfN, TiN, or the like, may also be used. Also, the buffer layer may be formed by combining a plurality of layers or by gradually changing a composition.

A silicon (Si) substrate has a coefficient of thermal expansion significantly different from that of GaN. Thus, in case of growing a GaN-based film on the silicon substrate, when a GaN film is grown at a high temperature and is subsequently cooled to room temperature, tensile stress is applied to the GaN film due to the difference in the coefficients of thermal expansion between the silicon substrate and the GaN film, causing cracks. In this case, in order to prevent the occurrence of cracks, a method of growing the GaN film such that compressive stress is applied to the GaN film while the GaN film is being grown is used to compensate for tensile stress. A significant difference in lattice constants between silicon (Si) and GaN involves a high possibility of the occurrence of defects. In the case of using a silicon substrate, a buffer layer 11a having a composite structure may be used in order to control stress for restraining warpage as well as controlling a defect.

For example, an AlN layer may be formed on the substrate 11 in order to form the buffer layer 11a. In this case, a material not including gallium (Ga) may be used in order to prevent a reaction between silicon (Si) and gallium (Ga). Besides AlN, a material such as SiC, or the like, may also be used. The AlN layer may be grown at a temperature ranging from about 400° C. to about 1300° C. by using an aluminum (Al) source and a nitrogen (N) source. An AlGaN interlayer may be inserted in the middle of GaN between a plurality of AlN layers in order to control stress.

The first conductivity-type semiconductor layer 12 and the second conductivity-type semiconductor layer 14 may be an n-type impurity doped semiconductor layer and a p-type impurity doped semiconductor layer, respectively but are not limited thereto. The first conductivity-type semiconductor layer 12 and the second conductivity-type semiconductor layer 14 may be a p-type semiconductor layer and an n-type semiconductor layer, respectively. By way of example, the first conductivity-type semiconductor layer 12 and the second conductivity-type semiconductor layer 14 may be formed of a group III nitride semiconductor, for example, a material having a composition of $Al_xIn_yGa_{1-x-y}N$ ($0 \leq x \leq 1$, $0 \leq y \leq 1$, $0 \leq x+y \leq 1$). The materials of the first conductivity-type semiconductor layer 12 and the second conductivity-type semiconductor layer 14 are not limited thereto, and may be an AlGaInP based semiconductor or an AlGaAs based semiconductor.

Meanwhile, the first and second conductivity-type semiconductor layers 12 and 14 may have a single layer structure but, in some exemplary embodiments, may have a multi-layer structure in which respective layers have different compositions, thicknesses or the like. For example, each of the first and second conductivity-type semiconductor layers 12 and 14 may include a carrier injection layer capable of improving injection efficiency of electrons and holes and further, may have a superlattice structure formed in various manners.

The first conductivity-type semiconductor layer 12 may further include a current spreading layer in a portion thereof adjacent to the active layer 13. The current spreading layer may have a structure in which a plurality of $Al_xIn_yGa_{1-x-y}N$ layers having different compositions or different impurity contents are repeatedly stacked or may be partially formed of an insulating material layer.

The second conductivity-type semiconductor layer 14 may further include an electron blocking layer in a portion thereof adjacent to the active layer 13. The electron blocking layer may have a structure in which a plurality of $Al_xIn_yGa_{1-x-y}N$ layers having different compositions are stacked or may have at least one layer configured of $Al_yGa_{(1-y)}N$. The second conductivity-type semiconductor layer 14 may have a band gap greater than that of the active layer 13 to prevent electrons from passing over the second conductivity-type semiconductor layer 14.

The first and second conductivity-type semiconductor layers 12 and 14 and the active layer 13 may be formed using an MOCVD device. In order to manufacture the first and second conductivity-type semiconductor layers 12 and 14 and the active layer 13, an organic metal compound gas (for example, trimethylgallium (TMG), trimethyl aluminum (TMA) or the like) and a nitrogen-containing gas (ammonia ($NH_3$) or the like) are supplied as a reaction gas, to a reaction container in which the growth substrate 11 is installed, and a temperature of the substrate is maintained at a high temperature of about 900° C. to about 1100° C., such that gallium nitride compound semiconductors may be grown on the substrate while supplying an impurity gas thereto in some exemplary embodiments, to thereby allow the gallium nitride compound semiconductors to be stacked as an undoped layer, an n-type layer, and a p-type layer, on the substrate. An n-type impurity may be Si, widely known in the art and a p-type impurity may be Zn, Cd, Be, Mg, Ca, Ba or the like. As the p-type impurity, Mg and Zn may be mainly used.

In addition, the active layer 13 interposed between the first and second conductivity-type semiconductor layers 12 and 14 may have a multiple quantum well (MQW) structure in which quantum well layers and quantum barrier layers are alternately stacked. For example, in the case that the active layer 13 includes a nitride semiconductor, the active layer 13 may have a structure of GaN and InGaN. Depending on exemplary embodiments, the active layer 13 may have a single quantum well (SQW) structure. The first or second electrode 15 or 16 may contain a material such as Ag, Ni, Al, Rh, Pd, Jr, Ru, Mg, Zn, Pt, Au or the like. The light emitting device 10 illustrated in FIG. 11 may have an Epi-up structure and accordingly, may be connected to circuit patterns included in a circuit board through a wire or the like within a light emitting device package.

Hereinafter, in light emitting devices of FIGS. 12 through 16, unless otherwise clearly contradicted by context, components of the light emitting devices according to the exemplary embodiments of FIGS. 12 through 16 may be understood with reference to the description of elements in connection with the exemplary embodiment of FIG. 11 as described above.

Figure 12:
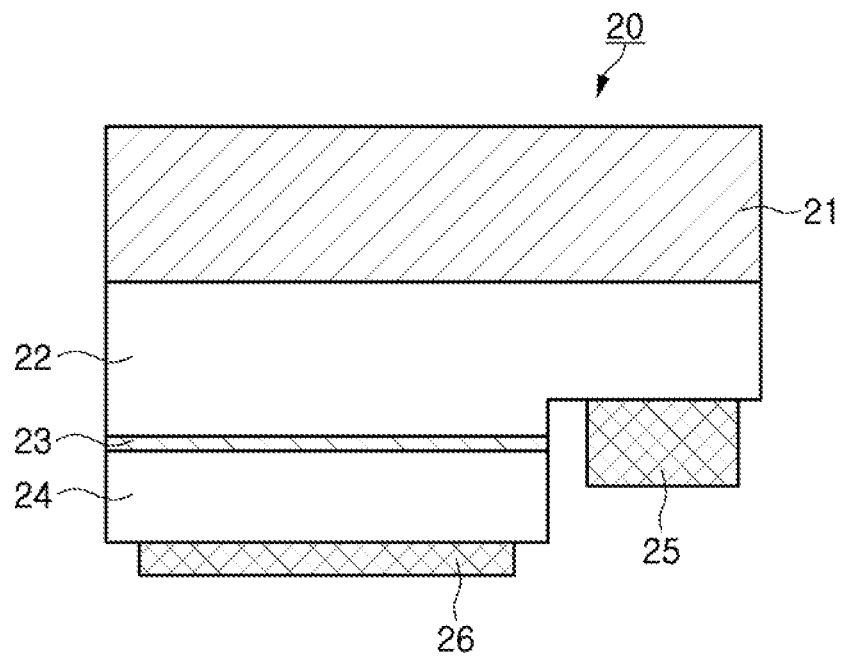

Referring to FIG. 12, a light emitting device 20 according to another exemplary embodiment may include a support substrate 21, first and second conductivity-type semiconductor layers 22 and 24, an active layer 13, and first and second electrodes 25 and 26. The light emitting device 20 according to the exemplary embodiment illustrated in FIG. 12 may be attached to a circuit board of a light emitting device package through flip-chip bonding. Since light generated in the active layer 23 is emitted upwardly, the support substrate 21 may be formed of a material having light-transmissive properties.

In addition, in order to reflect light generated in the active layer 23 and moving in a downward direction, the second electrode 26 may be formed of a material having excellent electrical conductivity and reflectance properties. In an example, the second electrode 26 may be formed of at least one of Ag, Ni, Al, Rh, Pd, Jr, Ru, Mg, Zn, Pt, and Au.

Since the light emitting device 20 illustrated in FIG. 12 may be attached to a circuit board of a light emitting device package using flip-chip bonding, the light emitting device 20 may be included in the light emitting device packages 100 and 200 as illustrated in the exemplary embodiments of FIG. 1A and FIG. 2A. That is, the reflective wall 111 or 211 may be attached to the side surface of the light emitting device 120, and the wavelength conversion film 130 or 230 may be attached to an upper surface of the support substrate 21.

Figure 13:
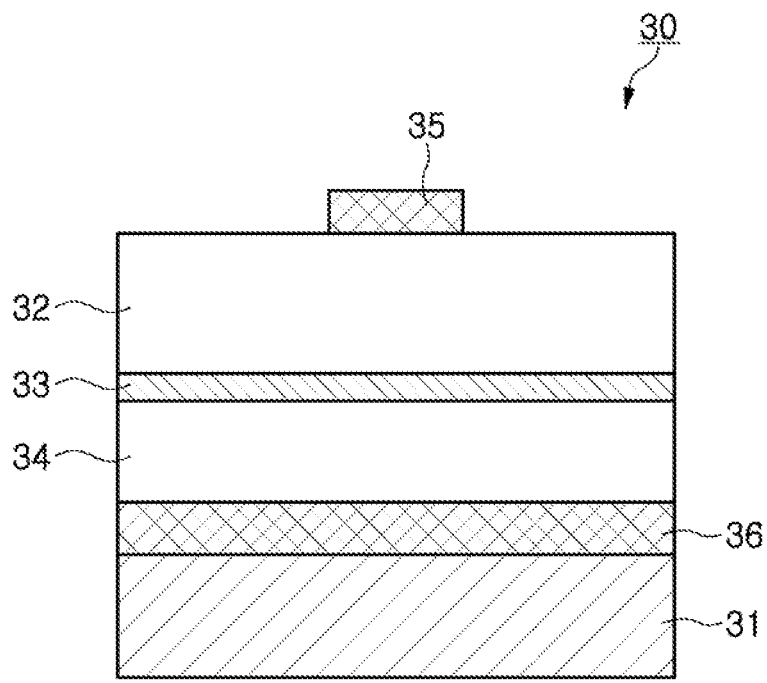

Referring to FIG. 13, a light emitting device 30 according to another exemplary embodiment is illustrated. The light emitting device 30 according to the exemplary embodiment illustrated in FIG. 13 may include a first conductivity-type semiconductor layer 32, an active layer 33, and a second conductivity-type semiconductor layer 34, a first electrode 35 attached to the first conductivity-type semiconductor layer 32, and a second electrode 36 attached to the second conductivity-type semiconductor layer 34, and the like. A conductive substrate 31 may be disposed on a lower surface of the second electrode 36 and may be directly mounted on a circuit board or the like, and provided to configure a light emitting device package. Within the light emitting device package, the conductive substrate 31 may be directly mounted on the circuit board, and the first electrode 35 may be electrically connected to circuit patterns of the circuit board through a wire or the like.

In a similar manner to the case of the semiconductor light emitting devices 10 and 20, the first conductivity-type semiconductor layer 32 and the second conductivity-type semiconductor layer 34 may include an n-type nitride semiconductor and a p-type nitride semiconductor, respectively. Meanwhile, the active layer 33 interposed between the first and second conductivity-type semiconductor layers 32 and 34 may have a multiple quantum well (MQW) structure in which nitride semiconductor layers having different compositions are alternately stacked and may selectively have a single quantum well (SQW) structure.

The first electrode 35 may be disposed on an upper surface of the first conductivity-type semiconductor layer 32 and the second electrode 36 may be disposed on a lower surface of the second conductivity-type semiconductor layer 34. Light generated due to the recombination of electrons and holes in the active layer 33 of the light emitting device 30 shown in FIG. 13 may be emitted to an upper surface of the first conductivity-type semiconductor layer 32 on which the first electrode 35 is disposed. Thus, in order to reflect light generated in the active layer 33 in a direction toward the upper surface of the first conductivity-type semiconductor layer 32, the second electrode 36 may contain at least one of Ag, Al, Ni, Cr, Cu, Au, Pd, Pt, Sn, Ti, W, Rh, Jr, Ru, Mg, and Zn, or an alloy material containing these materials.

Figure 14:
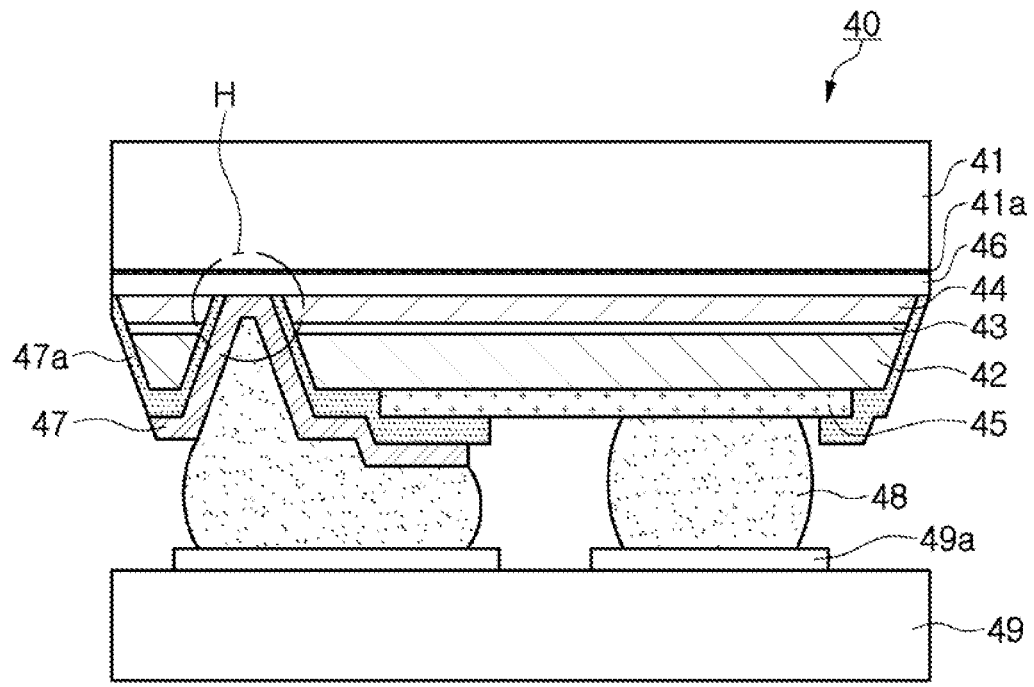

Referring to FIG. 14, a light emitting device 40 according to an exemplary embodiment may include a first conductivity-type semiconductor layer 42 and a second conductivity-type semiconductor layer 44, an active layer 43 interposed therebetween, and first and second electrodes 45 and 46 connected to the first and second conductivity-type semiconductor layers 42 and 44, respectively. In the exemplary embodiment, the first and second electrodes 45 and 46 may be disposed on opposite surfaces of the first and second conductivity-type semiconductor layers 42 and 44, respectively, and the active layer 43 interposed between the first and second electrodes 45 and 46. A support substrate 41 may be attached to the second electrode 46 through a bonding layer 41a and may support the light emitting device 40.

The light emitting device 40 according to the exemplary embodiment may further include a connecting electrode 47 as an electrode element in association with the second electrode 46. The connecting electrode 47 may be connected to the second electrode 46 through a through hole H formed by at least partially removing the first and second conductive-type semiconductor layers 42 and 44 and the active layer 43. At least a partial region of the second electrode 46 may be exposed through the through hole H and in the exposed region, the second electrode 46 and the connecting electrode 47 may be connected to each other. The connecting electrode 47 may be formed along a sidewall of the through hole H, and an insulating layer 47a may be provided between the connecting electrode 47 and the sidewall of the through hole H in order to prevent electrical connections between the connecting electrode 47 and the active layer 43 and the first conductivity-type semiconductor layer 42.

Such an electrode structure may be further efficiently applied to a form in which the first and second conductivity-type semiconductor layers 42 and 44 are n-type and p-type nitride semiconductor layers, respectively. Since the p-type nitride semiconductor layer has a degree of contact resistance greater than that of the n-type nitride semiconductor layer, it may be difficult to obtain ohmic-contact. However, in the exemplary embodiment illustrated in FIG. 14, since the second electrode 46 is disposed over the entire surface of the support substrate 41, a contact area between the second conductivity-type semiconductor layer 44 and the second electrode 46 may be sufficiently secured, whereby ohmic-contact between the second electrode 46 and the p-type nitride semiconductor layer may be obtained.

Meanwhile, the light emitting device 40 according to the exemplary embodiment illustrated in FIG. 14 may have a flip-chip structure in which light is emitted in a direction toward the support substrate 41. That is, the first electrode 45 and the connecting electrode 47 may be electrically connected to circuit patterns 49a of a circuit board 49 through solder bumps 48. Thus, the first electrode 45 may contain an electrode material having a high degree of reflectance as well as ohmic-contact characteristics. The second electrode 46 and the support substrate 41 may have high light-transmissive properties. For example, the first electrode 45 may contain a material such as Ag, Ni, Al, Rh, Pd, Jr, Ru, Mg, Zn, Pt, Au or the like. The second electrode 46 may be formed of a light-transmissive metal such as Ni/Au or may be formed of a transparent conductive oxide or nitride such as ITO. The support substrate 41 may be a glass substrate or a substrate formed of a light-transmissive polymer resin.

The connecting electrode 47 may be electrically insulated from the first conductivity-type semiconductor layer 42 and the active layer 43 by the insulating layer 47a. As illustrated in FIG. 14, the insulating layer 47a may be formed along the sidewall of the through hole H. In addition, the insulating layer 47a may be formed on side surfaces of the first and second conductivity-type semiconductor layers 42 and 44 and the active layer 43 and may be provided as a passivation layer for the light emitting device 10. The insulating layer 47a may contain a silicon oxide or a silicon nitride.

Figure 15:
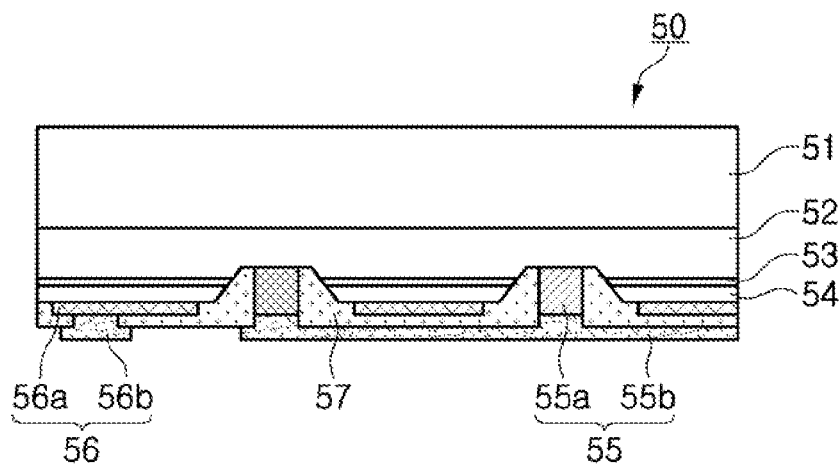

Then, referring to FIG. 15, a light emitting device 50 according to another exemplary embodiment is illustrated. The light emitting device 50 may include a first conductivity-type semiconductor layer 52, an active layer 53, and a second conductivity-type semiconductor layer 54 sequentially stacked on one surface of a substrate 51, and first and second electrodes 55 and 56. In addition, the light emitting device 50 may include an insulating portion 57. The first and second electrodes 55 and 56 may include contact electrodes 55a and 56a and connecting electrodes 55b and 56b, and partial regions of the contact electrodes 55a and 56a exposed by the insulating portion 57 may be connected to the connecting electrodes 55b and 56b.

The first contact electrode 55a may be provided as a conductive via penetrating through the second conductivity-type semiconductor layer 54 and the active layer 53 to be connected the first conductivity-type semiconductor layer 52. The second contact electrode 56a may be connected to the second conductivity-type semiconductor layer 54. A plurality of conductive vias may be provided in a single region of the light emitting device.

A conductive ohmic material may be deposited on the first and second conductivity-type semiconductor layers 52 and 54 to form first and second contact electrodes 55a and 56a. The first and second contact electrodes 55a and 56a may contain at least one of Ag, Al, Ni, Cr, Cu, Au, Pd, Pt, Sn, Ti, W, Rh, Ir, Ru, Mg, and Zn, or an alloy material containing these materials. In addition, the second contact electrode 56a may serve to reflect light generated in the active layer 53 and emitted downwardly of the light emitting device 50.

The insulating portion 57 may have open regions through which at least portions of the first and second contact electrodes 55a and 56a are exposed, and the first and second connecting electrodes 55b and 56b may be connected to the first and second contact electrodes 55a and 56a, respectively. The insulating portion 57 may be deposited at a thickness of about 0.01 µm to about 3 µm at a temperature of about 500° C. or lower through a $SiO_2$ and/or SiN CVD process. The first and second electrodes 55 and 56 may be mounted in a flip-chip scheme on a light emitting device package.

The first and second electrodes 55 and 56 may be electrically separated from each other by the insulating portion 57. Although the insulating portion 57 may be formed of any material as long as the material has electrical insulating properties, the insulating portion 57 may be preferably, formed of a material having a low light absorption rate in order to prevent a deterioration in light extraction efficiency. For example, a silicon oxide or a silicon nitride such as $SiO_2$, $SiO_xN_y$, $Si_xN_y$, or the like may be used. In some exemplary embodiments, a light reflecting structure may be formed by dispersing light reflective fillers in a light-transmissive material.

The substrate 51 may have first and second surfaces opposed to each other. An unevenness structure may be formed on at least one of the first and second surfaces. The unevenness structure formed on one surface of the substrate 51 may be formed by etching a portion of the substrate 51 and may be formed of the same material as that of the substrate 51, or may be configured of a heteromaterial different from that of the substrate 51. For example, an unevenness structure may be formed on an interface between the substrate 51 and the first conductivity-type semiconductor layer 52, such that a path of light emitted from the active layer 53 may be variously formed. Thus, a ratio at which light is absorbed in the interior of a semiconductor layer may be reduced and a light scattering ratio may be increased to thereby enhance light extraction efficiency. In addition, a buffer layer may be provided between the first substrate 51 and the first conductivity-type semiconductor layer 52.

Figure 16:
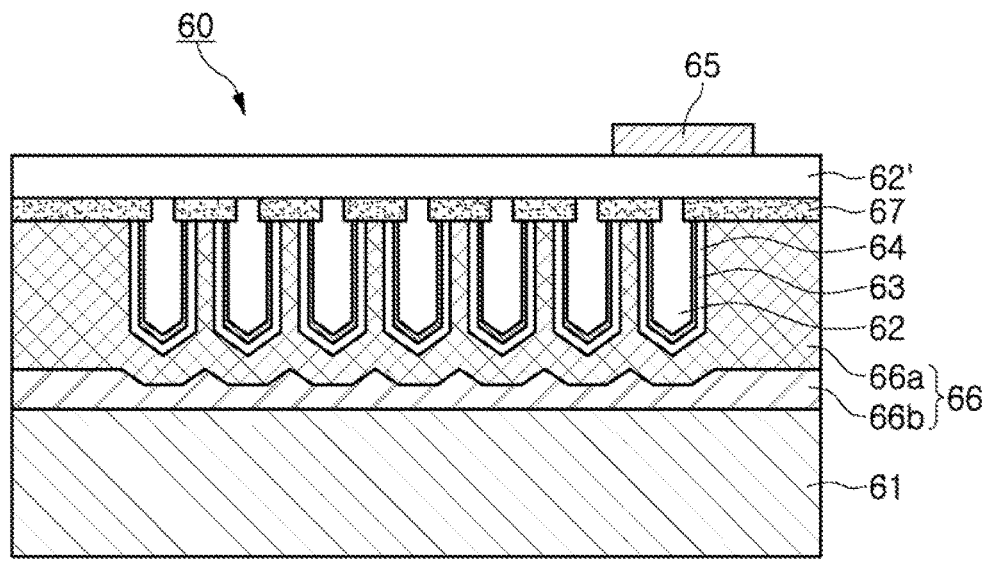

Referring to FIG. 16, a light emitting device 60 according to another exemplary embodiment may be a light emitting device 60 having a light emitting nanostructure. The light emitting device 60 may include a base layer 62' containing a first conductivity-type semiconductor material, a mask layer 67 provided on the base layer 62' and providing a plurality of openings, and nanocores 62 formed in the openings of the mask layer 67. On the nanocores 62, active layers 63 and second conductivity-type semiconductor layers 64 may be provided. The nanocores 62, the active layers 63 and the second conductivity-type semiconductor layers 64 may provide the light emitting nanostructure.

A second contact electrode 66a may be prepared on the second conductivity-type semiconductor layers 64, and a second connecting electrode 66b may be prepared on one surface of the second contact electrode 66a. The second contact electrode 66a and the second connecting electrode 66b may be provided as a second electrode 66. A support substrate 61 may be attached to one surface of the second electrode 66 and may be a conductive substrate or an insulating substrate. In the case that the support substrate 61 has conductivity, the support substrate 61 may be directly mounted on a circuit board of a light emitting device package. A first electrode 65 may be provided on the base layer 62' containing a first conductivity-type semiconductor material. The first electrode 65 may be connected to circuit patterns included in the circuit board of the light emitting device package through a wire or the like.

Figure 17:
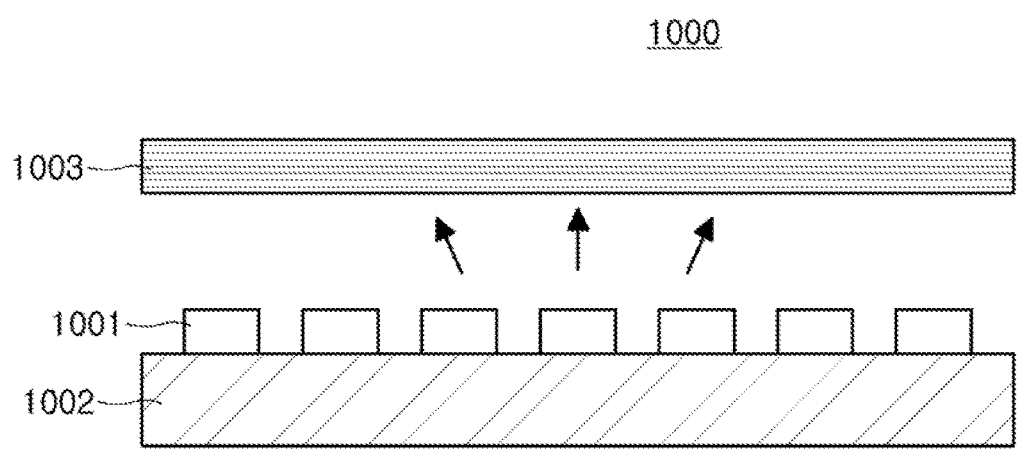
FIGS. 17 and 18 are views illustrating examples of backlight units in which the light emitting device package according to an exemplary embodiment is employed.
Figure 18:
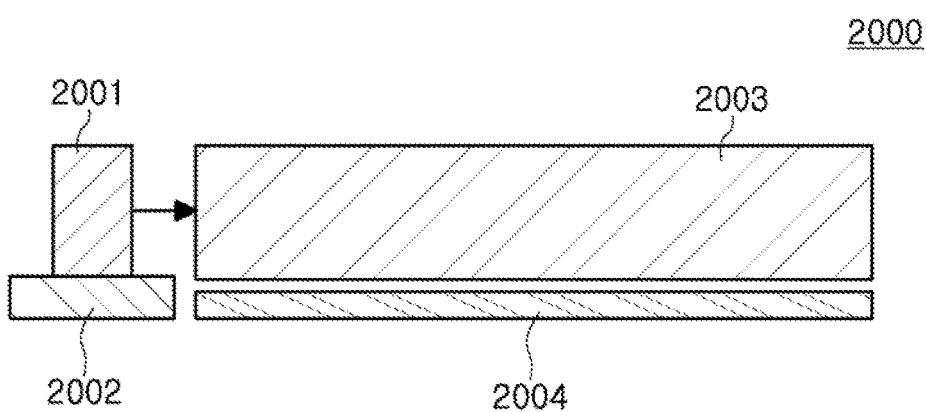

FIGS. 17 and 18 are views illustrating examples of backlight units in which the light emitting device package according to an exemplary embodiment may be employed.

Referring to FIG. 17, a backlight unit 1000 may include a substrate 1002, a light source 1001 mounted on the substrate 1002, and at least one optical sheet 1003 disposed thereabove. The optical sheet 1003 may include a diffusion sheet, a prism sheet and the like, and the light source 1001 may include the light emitting device package as described above.

The light source 1001 in the backlight unit 1000 of FIG. 17 emits light toward a liquid crystal display (LCD) device disposed thereabove. On the other hand, a light source 2001 mounted on a substrate 2002 in a backlight unit 2000 according to another embodiment illustrated in FIG. 18 emits light laterally, and the emitted light may be incident onto a light guide plate 2003 and may be converted into the form of a surface light source. The light having passed through the light guide plate 2003 may be emitted upwardly and a reflective layer 2004 may be formed below a bottom surface of the light guide plate 2003 in order to improve light extraction efficiency.

Figure 19:
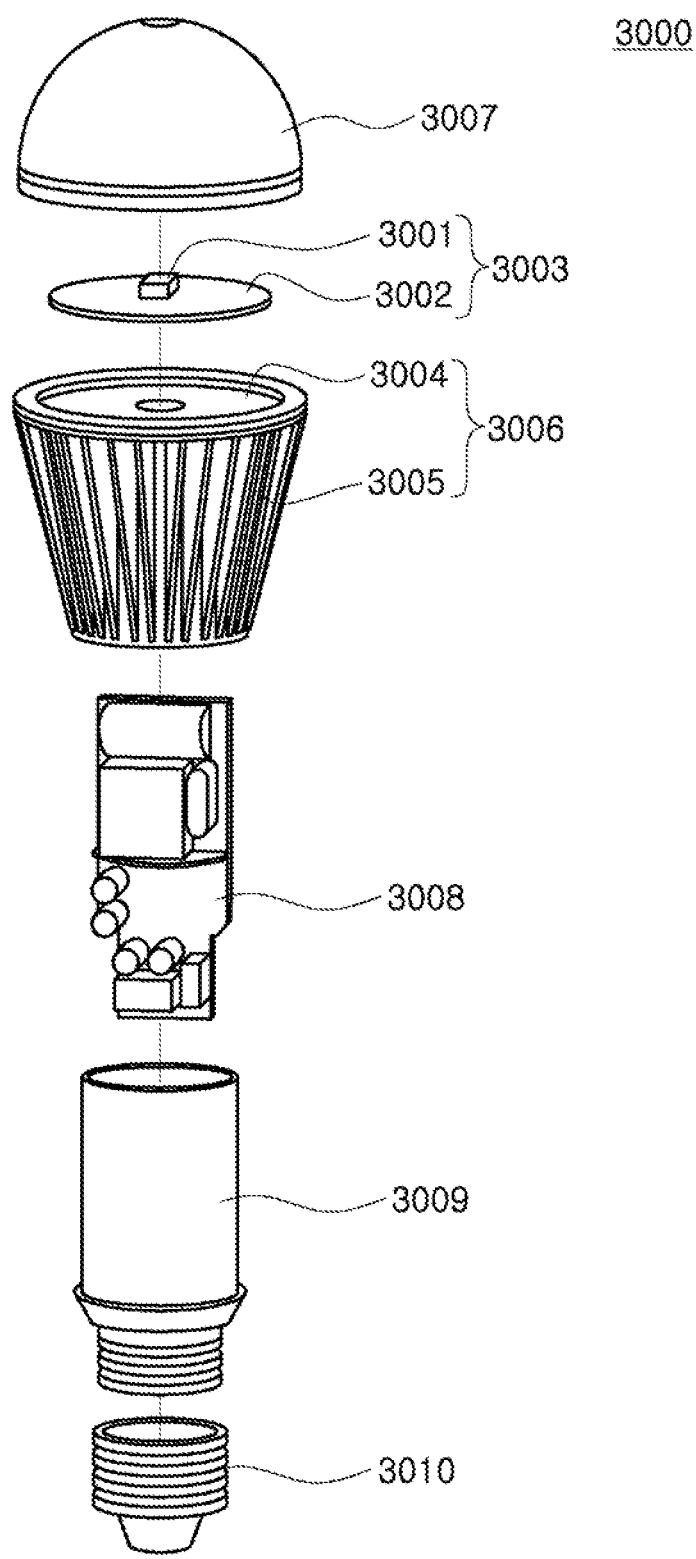
FIG. 19 is a view illustrating an example of a lighting device in which the light emitting device package according to an exemplary embodiment is employed.

FIG. 19 is a view illustrating an example of a lighting device in which the light emitting device package according to an exemplary embodiment may be employed.

A lighting device 3000 illustrated in FIG. 19 is exemplified as a bulb-type lamp, and may include a light emitting module 3003, a driving unit 3008, an external connector unit 3010 and the like.

In addition, exterior structures such as an external housing 3006, an internal housing 3009, a cover unit 3007 and the like may be further included in the lighting device 3000. The light emitting module 3003 may include a light source 3001 that may be the aforementioned semiconductor light emitting device or a package including the semiconductor light emitting device and a circuit board 3002 having the light source 3001 mounted thereon. The light source 3001 may include the light emitting device package as described above. The exemplary embodiment illustrates a case in which a single light source 3001 is mounted on the circuit board 3002; however, in some exemplary embodiments, a plurality of light sources may be mounted thereon.

The external housing 3006 may serve as a heat radiating part, and include a heat sink plate 3004 in direct contact with the light emitting module 3003 to improve the dissipation of heat and heat radiating fins 3005 covering a lateral surface of the lighting device 3000. The cover unit 3007 may be disposed above the light emitting module 3003 and may have a convex lens shape. The driving unit 3008 may be disposed inside the internal housing 3009 and may be connected to the external connector unit 3010, such as a socket structure, to receive power from an external power source.

In addition, the driving unit 3008 may convert the received power into a current source appropriate for driving the light emitting source 3001 of the light emitting module 3003 and supply the converted current source thereto. For example, the driving unit 3008 may be configured of an AC-DC converter, a rectifying circuit part, or the like.

Figure 20:
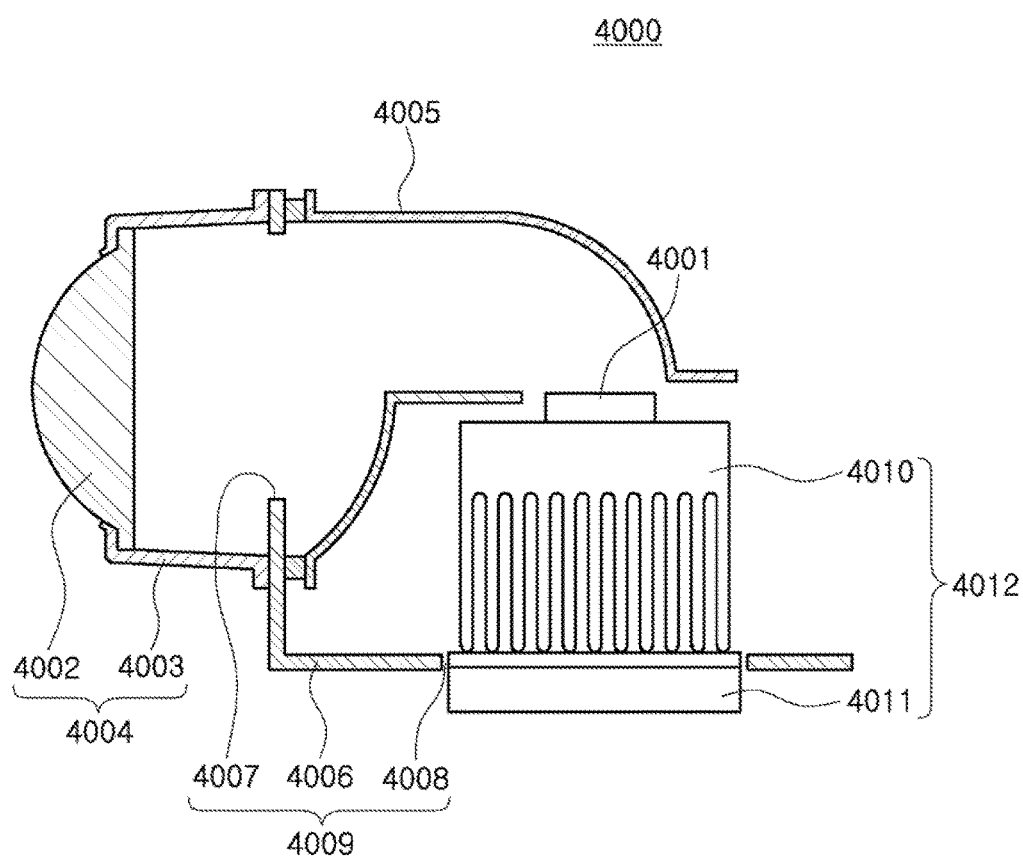
FIG. 20 is a view illustrating an example of a headlamp in which the light emitting device package according to an exemplary embodiment is employed.

FIG. 20 is a view illustrating an example of a headlamp in which the light emitting device package according to an exemplary embodiment may be employed.

FIG. 20 illustrates an example of applying the semiconductor light emitting device according to an exemplary embodiment to a headlamp.

Referring to FIG. 20, a headlamp 4000 used as a vehicle lighting element or the like may include a light source 4001, a reflective unit 4005 and a lens cover unit 4004, and the lens cover unit 4004 may include a hollow guide part 4003 and a lens 4002. The light source 4001 may include the aforementioned semiconductor light emitting device or a package including the semiconductor light emitting device.

The headlamp 4000 may further include a heat radiating unit 4012 dissipating heat generated by the light source 4001 outwardly. The heat radiating unit 4012 may include a heat sink 4010 and a cooling fan 4011 in order to effectively dissipate heat. In addition, the headlamp 4000 may further include a housing 4009 allowing the heat radiating unit 4012 and the reflective unit 4005 to be fixed thereto and supported thereby. The housing 4009 may include a central hole 4008 to which the heat radiating unit 4012 is coupled to be mounted therein, the central hole 4008 being formed in one surface of the housing 4009.

The other surface of the housing 4009 integrally connected to and bent in a direction perpendicular to the one surface of the housing 4009 may be provided with a forward hole 4007 such that the reflective unit 4005 may be disposed above the light source 4001. Accordingly, a forward side may be opened by the reflective unit 4005 and the reflective unit 4005 may be fixed to the housing 4009 such that the opened forward side corresponds to the forward hole 4007, whereby light reflected by the reflective unit 4005 may pass through the forward hole 4007 to thereby be emitted outwardly.

As set forth above, according to exemplary embodiments of the present inventive concept, a wavelength conversion film included in a light emitting device package may have a first layer and a second layer sequentially stacked and in this case, the first layer may be disposed to be adjacent to a light emitting device and a surface of the second layer may be partially exposed to air. A refractive index of the second layer may be lower than a refractive index of the first layer and may be higher than a refractive index of air. Thus, a quantity of light not emitted externally due to internal reflection in a boundary surface between the wavelength conversion film and air may be decreased to improve light extraction efficiency, whereby luminance in the light emitting device package may be improved.

While exemplary embodiments have been shown and described above, it will be apparent to those skilled in the art that modifications and variations could be made without departing from the scope of the inventive concept as defined by the appended claims.

What is claimed is:
1. A light emitting device package comprising:
 a package body;
 a light emitting device coupled to at least a first portion of the package body; and
 a wavelength conversion film disposed on the light emitting device so that light emitted by the light emitting device passes through the wavelength conversion film,
 wherein the wavelength conversion film comprises a wavelength conversion material that changes a wavelength of the light emitted by the light emitting device,
 the wavelength conversion film includes a first layer disposed to be adjacent to the light emitting device and having a first refractive index, and a second layer attached to the first layer and having a second refractive index less than the first refractive index of the first layer and greater than a third refractive index of air, and
 the package body includes a reflective wall attached to a side surface of the light emitting device.

2. The light emitting device package of claim 1, wherein a second thickness of the second layer is less than a first thickness of the first layer.

3. The light emitting device package of claim 1, wherein the wavelength conversion film includes an unevenness structure formed on at least a second portion of a surface of the second layer.

4. The light emitting device package of claim 3, wherein a height of the unevenness structure is less than a thickness of the second layer.

5. The light emitting device package of claim 3, wherein the unevenness structure comprises a plurality of unevenness structures that have at least one of a polypyramidal shape, a conical shape, and a hemispherical shape.

6. The light emitting device package of claim 1, wherein the first layer includes the wavelength conversion material, and an encapsulant encapsulating the wavelength conversion material and having the first refractive index.

7. The light emitting device package of claim 1, wherein at least a second portion of the first layer is attached to a first upper surface of the light emitting device and a second upper surface of the reflective wall.

8. The light emitting device package of claim 7, wherein the first upper surface of the light emitting device and the second upper surface of the reflective wall are coplanar.

9. The light emitting device package of claim 1, wherein the reflective wall has substantially the same width in a height direction of the reflective wall.

* * * * *